United States Patent [19]

Kunz

[11] Patent Number: 4,939,461

[45] Date of Patent: Jul. 3, 1990

[54] METHOD OF DETERMINING THE NUCLEAR MAGNETIZATION DISTRIBUTION, AND DEVICE FOR PERFORMING THE METHOD

[75] Inventor: Dietmar W. Kunz, Quickborn, Fed. Rep. of Germany

[73] Assignee: U.S. Philips Corporation, New York, N.Y.

[21] Appl. No.: 321,492

[22] Filed: Mar. 10, 1989

[30] Foreign Application Priority Data

Mar. 12, 1988 [DE] Fed. Rep. of Germany ....... 3808281

[51] Int. Cl.$^5$ ............................................. G01R 33/20
[52] U.S. Cl. ..................................... 324/309; 324/307
[58] Field of Search ........................ 324/300, 307, 309; 128/653

[56] References Cited

U.S. PATENT DOCUMENTS 4,820,984 4/1989 Kuhn et al. .......................... 324/309

4,843,549 6/1989 McKinnon ........................... 324/309

*Primary Examiner*—Michael J. Tokar
*Attorney, Agent, or Firm*—Thomas A. Briody; Jack E. Haken; Jack D. Slobod

[57] ABSTRACT

A method of and a system for, determining the nuclear magnetization distribution, where a plurality of sequences act on an examination zone in the presence of a uniform, steady magnetic field, each sequence comprising an r.f. pulse whereby, in conjunction with a magnetic gradient field, the nuclear magnetization in the zones situated on both sides of a layer to be examined is excited and possibly dephased. The r.f. peak power can be reduced by modulating a signal on a carrier whose frequency corresponds to the Larmor frequency in the center of the layer to be examined, the frequency of said signal varying in a range which corresponds to differences between said Larmor frequency and the Larmor frequencies in one of the zones.

14 Claims, 3 Drawing Sheets

METHOD OF DETERMINING THE NUCLEAR MAGNETIZATION DISTRIBUTION, AND DEVICE FOR PERFORMING THE METHOD

BACKGROUND OF THE INVENTION

1. Field of the Invention

The invention relates to a method of determining the nuclear magnetisation distribution, where a plurality of sequences act on an examination zone in the presence of a uniform, steady magnetic field, each sequence comprising an r.f. pulse whereby, in conjunction with a magnetic gradient field, the nuclear magnetisation in the zones situated on both sides of a layer to be examined is excited and possibly dephased, and also relates to a device for performing this method.

2. Description of the Prior Art

A method and a device of this kind are known from DE-OS No. 36 04 281 corresponding to U.S. Pat. No. 4,733,184, issued Mar. 27, 1988 to the same assignee as herein, which is incorporated by reference. Therein, the nuclear magnetisation in the zones situated on both sides of a layer to be examined can be excited and dephased by means of one or two successive r.f. pulses in conjunction with a magnetic gradient field.

In the known method an amplitude-modulated r.f. pulse is generated in that in a modulator the oscillations of an oscillator are multiplied in known manner by an envelope signal which corresponds to the variation in time of the amplitude of the oscillator signal. Such an r.f. pulse has the property that the required r.f. peak power is higher as the thickness of the zone to be influenced thereby is greater. Therefore, the known method, requires comparatively high peak powers.

SUMMARY OF THE INVENTION

It is an object of the invention to provide a method of the kind set forth for which a lower r.f. peak power suffices. This object is achieved in accordance with the invention in that on a carrier whose frequency corresponds to the Larmor frequency in the centre of the layer to be examined there is modulated a signal whose frequency varies in a range which corresponds to the difference between said Larmor frequency and the Larmor frequencies in one of the zones.

Thus, the invention utilizes a frequency modulated r.f. pulse. It is known that the generating of frequency modulated r.f. pulses requires a peak power which is lower than that required for generating amplitude modulated r.f. pulses for the same flip angle (EP OS No. 85 200 644.4). This is because the duration of an amplitude-modulated r.f. pulse is inversely proportional to its bandwidth, and hence to the thickness of the zone to be excited thereby, while the duration of a frequency modulated pulse can be chosen substantially independently of the bandwidth; thus, it can be chosen to be so large that only a comparatively low r.f. peak power is required.

The generating of a frequency modulated r.f. pulse customarily requires a frequency modulator. Such a frequency modulator may comprise (see FIG. 5 of EP-OS No. 85 200 644) two modulators which operate as multiplying mixers of which inputs receive a signal corresponding to the real component and the imaginary component, respectively, of the frequency-modulated signal. The modulators customarily utilised in MR examination apparatus, however, comprise only one multiplying mixing stage which is not capable of performing such frequency modulation. The method in accordance with the invention, however, can be performed by means of such a modulator. This is based on the following considerations:

A frequency-modulated r.f. pulse which, in one of the two zones on both sides of a layer to be examined, influences the nuclear magnetisation from the edge of this layer until the end of the receiving or transmission range of the r.f. coil, can be represented as a complex function with respect to the Larmor frequency in the centre of the layer to be examined. A complex r.f. pulse conjugated in this representation, i.e. a pulse having the same amplitude, the same real component and an inverted imaginary component, would successively assume exactly the negative frequencies taken with respect to the frequency in the centre of the layer. This means that it would pass, in the opposite direction, through a zone from the other edge of the layer to the other end of the transmission or receiving range of the object. When the frequency distance between the two edges of the layer is sufficiently large and the r.f. field strength used is not excessively high, both r.f. pulses can be simultaneously applied to the examination zone without influencing one another. This corresponds to the addition of the two mutually conjugated complex r.f. pulses, where the real components are added and the imaginary components compensate for one another. Therefore, it is merely necessary to modulate the real component of the frequency-modulated signal on the carrier; this can be realised by means of an amplitude modulator customarily used such the purposes.

The r.f. pulse may be a 90° r.f. pulse as well as a 180° r.f. pulse. A 90° r.f. pulse excites both zones on both sides of the layer, the layer itself not being excited. In order to examine the nuclear magnetisation distribution in the layer, the nuclear magnetisation in the zones on both sides of the layer must be dephased and subsequently there must be generated at least one non-selective r.f. pulse which influences the nuclear magnetisation in the entire r.f. range. Because the nuclear magnetisation outside the layer has already been dephased, however, only the layer itself makes a contribution to the spin resonance signals relating to this r.f. pulse or these r.f. pulses.

In a further version of the invention, the necessary dephasing in the zones on both sides of the layer can be particularly simply realised by varying the frequency of the signal so that the absolute value of the difference increases in time. The excitation progresses towards the exterior in the zones. Because a magnetic gradient field is applied during the entire r.f. pulse, in this version the nuclear magnetisation immediately adjacent both sides of the layer has already been dephased at the end of the r.f. pulse, so that in this case the magnetic gradient field can be deactivated at the end of the r.f. pulse or shortly thereafter.

A device for performing the method in accordance with the invention, comprising a magnet for generating a uniform, steady magnetic field, a gradient coil system for generating magnetic fields which extend in the direction of the steady magnetic field and which have gradients extending in different directions, an r.f. coil system for generating an r.f. magnetic field which extends perpendicularly with respect to the steady magnetic field, and an r.f. generator which can be coupled to the r.f. coil system and which comprises a modulator operating as a multiplying mixing stage, is characterized in that there is provided a signal generator which supplies a frequency-modulated signal, and in that in the modulator the oscillations of an oscillator which can be tuned to the Larmor frequency are multiplied by the signal.

In a preferred embodiment there is provided a memory in which the signal is stored as a series of digital data words, the memory being coupled to an input of the modulator via a digital-to-analog converter.

The invention will be described in detail hereinafter with reference to drawings, therein.

DETAILED DESCRIPTION OF THE PREFERRED EMBODIMENT

Figure 1:
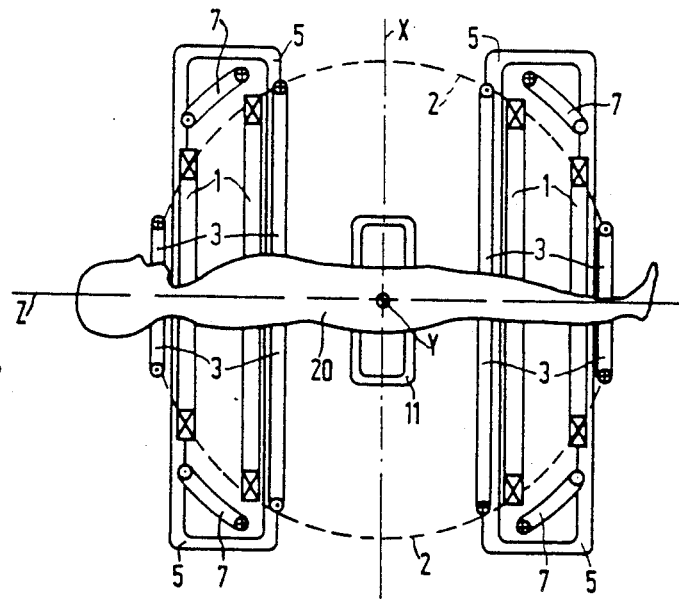
FIG. 1 shows an MR examination appartus in which the invention can be used.

The MR tomography apparatus shown in FIG. 1 comprises a system which consists of four coils 1 for generating a uniform, steady magnetic field which may be in the order of magnitude of from some tenths of T to some T. This field extends in the z-direction of a cartesian coordinate system. The coils 1 which are concentrically arranged with respect to the z-axis may be situated on a spherical surface 2. The patient 20 to be examined is arranged within these coils.

Four coils 3 which are preferably arranged on the same spherical surface are provided for generating a magnetic field Gz which extends in the z-direction and which linearly varies in this direction. There are also provided four coils 7 which generate a magnetic gradient field Gx which also extends in the z-direction but whose gradient extends in the x-direction. A magnetic gradient field Gy which extends in the z-direction with a gradient in the y-direction is generated by four coils 5 which may be identical to the coils 7 but which are arranged so as to be 90° offset in space with respect thereto. Only two of these four coils 5 are shown in FIG. 1.

Because each of the three coils systems 3, 5 and 7 for generating the magnetic gradient fields Gz, Gy and Gx is symmetrically arranged with respect to the spherical surface 2, the field strength in the centre of the sphere, forming at the same time the origin of said cartesian x, y, z coordinate system, is determined exclusively by the steady, uniform magnetic field of the coil system 1. Furthermore, an r.f. coil 11 is symmetrically arranged with respect to the plane z=O of the coordinate system, which coil is constructed so that it generates an essentially uniform r.f. magnetic field which extends in the x-direction, i.e. perpendicularly to the direction of the steady, uniform magnetic field. The r.f. coil receives an r.f. modulated current from an r.f. generator during each r.f. pulse. Subsequent to one or more r.f. pulses, the r.f. coil 11 serves for the reception of the echo signals produced by spin resonance in the examination zone. Instead, however, use could be made of a separate r.f. receiver coil.

Figure 2:
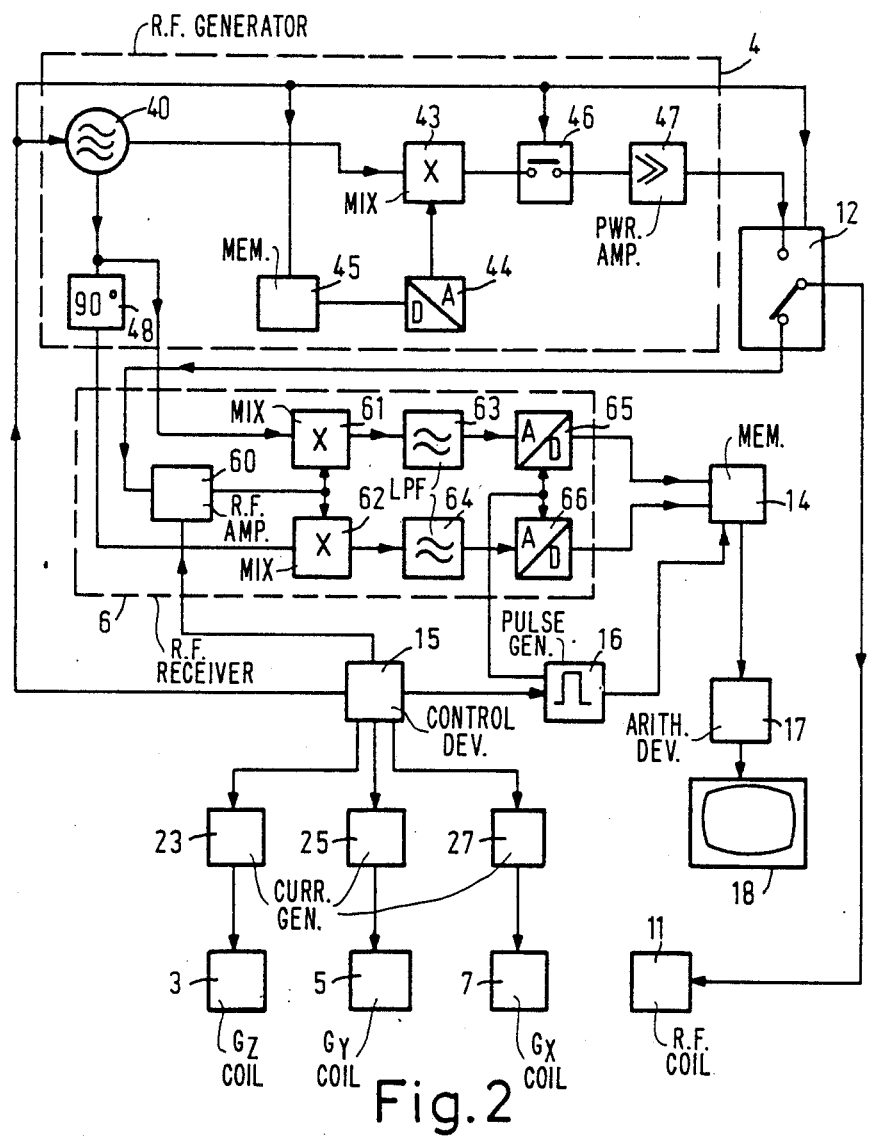
FIG. 2 shows a block diagram of such an apparatus.

FIG. 2 shows a simplified block diagram of this MR tomography apparatus. The r.f. coil 11 is connected, via a switching device 12, to an r.f. generator 4 on the one side and to an r.f. receiver 6 on the other side.

The r.f. generator 4 comprises an r.f. oscillator 40 whose frequency can be digitally controlled and which produces oscillations having a frequency which, at the field strength generated by the coils 1 is equal to the Larmor frequency of the nuclei whose spatial distribution is to be determined in the layer. As is known, the Larmor frequency f is calculated in accordance with the relation f=cB, where B is the magnetic induction in the steady, uniform magnetic field and c is the gyromagnetic ratio which amounts to, for example 42.56 MHz/T for hydrogen protons and to 11.26 MHz/T for the sodium isotope Na 23. The output of the oscillator 40 is connected to an input of a mixing stage 43. The mixing stage 43 receives a second input signal from a digital-to-analog converter 44 whose input is connected to a digital memory 45. Under the control of a control device 15, a series of digital data words representing a frequency-modulated signal is read from the memory 45.

The multiplying mixing stage 43 produces an output signal which is proportional to the product of the signals applied to its inputs. The frequency modulated signal is thus amplitude modulated on the carrier. The output signal of the mixing stage 43 is applied, via a switch 46 which is controlled by the control device 15, to an r.f. power amplifier 47 whose output is connected to the switching device 12. This device is also controlled by the control device 15.

The receiver 6 comprises an r.f. amplifier 60 which is connected to the switching device and which receives the echo signals, induced in the r.f. coil 11 and produced by spin resonance, when the switching device 12 is controlled accordingly. The amplifier 60 comprises a muting input which is controlled by the control device 15 and via which it can be blocked so that the gain is substantially zero. The output of the amplifier 60 is connected to the first inputs of two multiplying mixing stages 61 and 62, each of which supplies an output signal which corresponds to the product of their input signals. The second inputs of the mixing stages 61 and 62 receive a signal having the frequency of the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via low pass filters 63 and 64 which suppress the frequency supplied by the oscillator 40 as well as all higher frequencies and which conduct lower-frequency components, to a respective analog-to-digital converter 65, 66. This converter converts the analog signals of the circuit 61 ... 64 forming a quadrature demodulator, into digital data words which are applied to a memory 14. The analog-to-digital converters 65 and 66 as well as the memory 14 receive their clock pulses from a clock pulse generator 16 which can be blocked and released by the control device 15, via a control lead, so that the signals supplied by the r.f. coil 11 and transposed to the low-frequency range are converted into a series of digital data words for storage in the memory 14 only in a measuring interval which is defined by the control device 15.

The current generators 23, 25 and 27 supply the three coil systems 3, 5 and 7 with a respective current whose variation in time can be controlled by the control unit 15. The data words or sampling values stored in the memory 14 are applied to an arithmetic device 17 which determines the spatial distribution of the nuclear magnetisation in the layer examined therefrom and which applies the distribution determined to a suitable display apparatus, for example a monitor 18.

Figure 3:
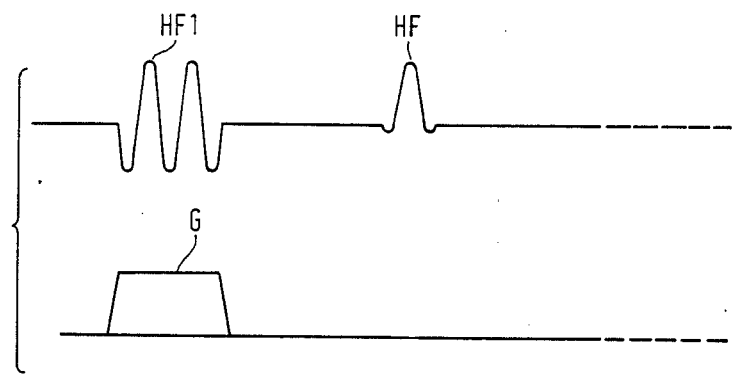
FIG. 3 shows the position in time of various signals in a sequence suitable for use in accordance with the invention.

FIG. 3 shows the position in time of various signals for a part of a sequence in which the invention can be used. HF1 (first line) denotes a frequency modulated r.f. pulse. During this r.f. pulse a magnetic gradient field G is activated (second line), for example in that the current generator 23 supplies a current for the gradient coil system 3 during the r.f. pulse. The r.f. pulse HF1, being a 90° r.f. pulse, ensures, in conjunction with the magnetic gradient field G, that the nuclear magnetisation is excited and dephased in the examination zone 20 on both sides of the layer determined by the frequency of the oscillator 40.

The nuclear magnetisation in the entire examination zone is excited by a further r.f. pulse HF, subsequent to the first r.f. pulse HF1, during which no magnetic gradient field is activated. Because the nuclear magnetisation outside the layer, however, has already been dephased by the r.f. pulse HF1, only the nuclear magnetisation inside the layer will then make a contribution to the spin resonance signal occurring after the r.f. pulse HF. Instead of the preferably 90° r.f. pulse HF, two or more further r.f. pulses can be generated within a sequence. By activating magnetic gradient fields between or after these r.f. pulses, the nuclear magnetisation inside the layer can be determined by means of a plurality of sequences with parameters which vary from one sequence to another.

However, it is also possible to generate first three successive frequency-modulated 90° r.f. pulses within a sequence, to activate a magnetic gradient field during each of these r.f. pulses, the gradient direction of said field being rotated through 90° from one pulse to another (so that the nuclear magnetisation is dephased everywhere outside a volume defined by the three mutually perpendicular layers), and to generate a non-selective r.f. pulse thereafter. This pulse generates a resonance signal which is determined by the nuclear magnetisation, and the spectral distribution thereof, in the volume element.

Figures 4A, 4B:
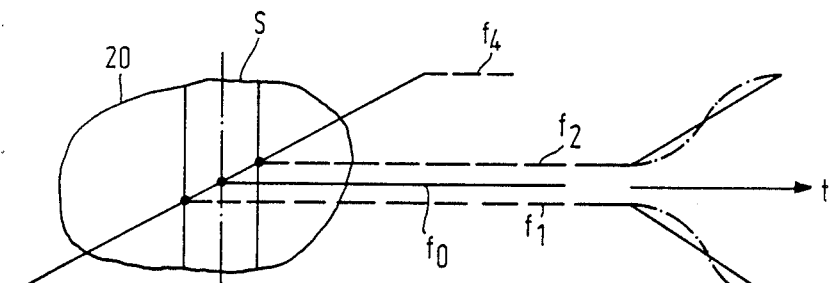
FIG. 4a shows the assignment in time of the Larmor frequencies.
FIG. 4b shows the variation in time of the frequency for an r.f. pulse.

FIG. 4a shows the object 20 to be examined and the layer S which extends perpendicularly to the plane of drawing and which is obtained when the gradient of the magnetic gradient field extends in the horizontal direction. In the case of a constant gradient, the Larmor frequency in the examination zone defined by the object 20 varies linearly from left to right in known manner. It amounts to $f_0$ in the centre of layer S; at the left-hand edge and the right-hand edge of the layer it amounts to $f_1$ and $f_2$, respectively. The left-hand edge and the right-hand edge of the examination zone are situated within the zone defined by the Larmor frequencies $f_3$ and $f_4$, respectively, for which $$f_4 - f_2 = f_1 - f_3.$$

The memory 45 (FIG. 2) stores a series of data words which produces, when the memory content is read under the control of the control unit 15 and processed by the digital-to-analog converter 44, a signal having a frequency which varies linearly from a first value, corresponding to the difference $f_2 - f_0$, to a second value corresponding to the difference $f_4 - f_0$. The rate of variation of the frequency is such that the said range is covered exactly once during the duration of the r.f. pulse HF1 (for example 5 ms).

Because the variations imposed by the magnetic gradient field on the uniform, steady magnetic field generated by the coils 1 are small in comparison with the field strength of this magnetic field, the instantaneous frequency of the output signal of the digital-to-analog converter 44 is low in comparison with the Larmor frequency. Therefore, this signal can be stored in the memory 45 using comparatively few data words, the envelope of this signal preferably being chosen as described in European Patent Application No. 85 200 644.

In the mixing stage 43 this signal is mixed with the sinusoidal signal of the oscillator 40 tuned to the frequency $f_0$. The output signal of the mixing stage 43, being proportional to the product of these input signals, therefore contains a component whose frequency varies linearly from a value $f_2$ to a value $f_4$ (see FIG. 4b) and a component whose frequency distance from $f_0$ varies to the same extent, but in the opposite direction with respect to the former component, i.e. from $f_1$ to $f_3$. Thus, the resultant r.f. pulse HF1 ensures first the Larmor frequencies of the two zones directly adjoining the layer occur in the r.f. pulse HF1 and subsequently those of the zones which are situated further away. The nuclear magnetisation thus excited in these zones, however, is dephased in that the magnetic gradient field G remains activated beyond this excitation. The nuclear magnetisation in the parts of the examination zone situated on both sides of the layer S is thus dephased when the magnetic gradient field G is deactivated by the r.f. pulse HF1 or, if necessary, briefly afterwards.

The frequency need not vary linearly; for example, a frequency variation in accordance with a tangent hyperbolic function may also be useful as denoted by stroke/dot lines in FIG. 4b. In that case the envelope of the signal of variable frequency, stored in the memory 45, should follow a secant hyperbolic function (J. Chem. Phys. 79, 9 November 1983, pages 4643–4644).

Figure 5:
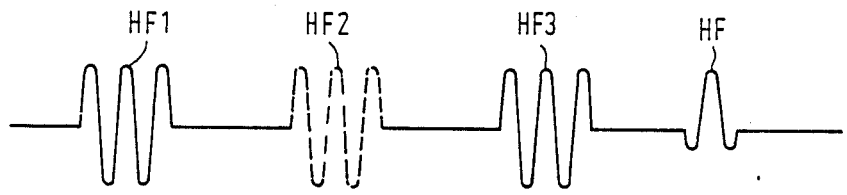
FIG. 5 shows a second sequence suitable for use in accordance with the invention.

The method shown in FIG. 5 is based on the so-called ISIS method which is described in J. Magn. Reson. 66 pages 283 to 294 (1986) and in which up to three 180° r.f. pulses act on an examination zone, each r.f. pulse inverting the nuclear magnetisation in one of three mutually perpendicular layers. By using the frequency modulated r.f. pulses, the nuclear magnetisation on both sides of the relevant layer is excited, the nuclear magnetisation in the layer itself remaining unchanged. The following holds good:

The method involves cycles comprising eight sequences each. Each sequence comprises up to three layer-selective frequency-modulated 180° r.f. pulses HF1, HF2 and HF3, as well as each time a non-selective r.f. pulse HF which is preferably a 90° pulse. The eight sequences of a cycle comprise the three r.f. pulses HF1 to HF3 in the eight feasible combinations. One of the eight sequences thus comprises none of the three r.f. pulses, whilst one other sequence comprises all three r.f. pulses. Each time three of the sequences comprise only one and two of the r.f. pulses in a different combination.

The single sequence of the cycle shown in FIG. 5 comprises only of the r.f. pulse HF1 (first line), relating to the magnetic gradient field Gx (second line), and the r.f. pulse HF3 relating to the magnetic gradient field Gx (fourth line). The position of the second r.f. pulse HF2, not being included in this sequence, and of the magnetic gradient field Gy (third line) relating thereto, is denoted by broken lines in FIG. 5. The pulse HF3 succeeds the further r.f. pulse HF which excites the entire examination zone and generates a spin resonance signal which originates from the entire examination zone. This spin resonance signal is sampled, i.e. the pulse generator 16 is enabled (see fifth line). Each of the r.f. pulses HF1 ... HF3 inverts the nuclear magnetisation on both sides of a layer which extends perpendicularly to the direction of the gradient associated with the r.f. pulse. Consequently, in the zone of intersection of the three mutually perpendicular layers the nuclear magnetisation is not inverted by any of the r.f. pulses. In any other location of the examination zone four of the sequences have an inverting effect and the other sequences have a non-inverting effect. Therefore, when the spin resonance signals generated in the eight sequences of a cycle are added, only the said zone of intersection will make a contribution, the component of the resonance signals originating from the other zones each time cancelling one another.

The r.f. pulses HF1 and HF3 are generated in the same way as described with reference to the FIGS. 3 and 4a and b. However, their energy content is greater, so that a flip angle of 180° is obtained. In this case dephasing of the nuclear magnetisation is neither possible nor necessary; the 180° r.f. pulses thus frequency modulated merely invert the nuclear magnetisation on each side of a layer.

I claim:

1. A method of determining the nuclear magnetisation distribution, where a plurality of sequences act on an examination zone in the presence of a uniform, steady magnetic field, each sequence comprising an r.f. pulse whereby, in conjunction with a magnetic gradient field for varying Larmor frequency in a direction of layer selection, the nuclear magnetisation in two zones situated on opposite sides of a selected layer to be examined is excited, said r.f. pulse being formed by amplitude modulating a carrier whose frequency corresponds to a Larmor frequency in a center of the selected layer to be examined with a signal having a frequency which varies in a range which corresponds to differences between a Larmor frequency in the center of said layer and Larmor frequencies in one of the zones.

2. A method as claimed in claim 1, characterized in that the frequency of the signal is varied so that the absolute value of the difference increases in time.

3. A method as claimed in claim 1, characterized in that the r.f. pulse is a 90° r.f. pulse.

4. A method as claimed in claim 1, characterized in that the r.f. pulse is a 180° r.f. pulse.

5. A method as claimed in claim 1, characterized in that the frequency changes linearly in time.

6. A method as claimed in claim 1, characterized in that the frequency of the signal varies in time as a hyperbolic tangent function.

7. A device for determining the nuclear magnetisation distribution in a selected layer within an examination zone in which the nuclear magnetisation in two zones situated on opposite sides of the selected layer is excited comprising: a steady field means for generating a steady magnetic field in a predetermined direction, a gradient field magnet means for generating a magnetic gradient field which extends in the direction of the steady magnetic field and which has a gradient in a layer selection direction for varying Larmor frequency in the layer selection direction, an r.f. coil system for generating an r.f. magnetic field which extends perpendicularly to the steady magnetic field, an r.f. generator which comprises an oscillator tunable to a Larmor frequency corresponding to a center of a selected layer, a signal generator having an output signal, and a modulator for amplitude modulating the oscillations of said oscillator with the output signal, characterized in that the signal generator generates a frequency modulated output signal varying in a frequency range corresponding to differences between a Larmor frequency in a center of the selected layer and Larmor frequencies in one of said two zones situated on opposite sides of the selected layer.

8. A device as claimed in claim 7, characterized in that the signal generator comprises a memory (45) in which a series of digital data words is stored for forming the output signal, and also comprises a digital-to-analog converter (44) via which the memory (45) is coupled to an input of the modulator (43).

9. A method as claimed in claim 2, characterized in that the r.f. pulse is a 90° r.f. pulse.

10. A method as claimed in claim 5, characterized in that the r.f. pulse is a 90° r.f. pulse.

11. A method as claimed in claim 6, characterized in that the r.f. pulse is a 90° r.f. pulse.

12. A method as claimed in claim 2, characterized in that the r.f. pulse is a 180° r.f. pulse.

13. A method as claimed in claim 5, characterized in that the r.f. pulse is a 180° r.f. pulse.

14. A method as claimed in claim 6, characterized in that the r.f. pulse is a 180° r.f. pulse.

* * * * *